United States Patent
Cheng (10) Patent No.: US 7,663,423 B1
(45) Date of Patent: Feb. 16, 2010

(54) LEVEL SHIFT CIRCUIT (75) Inventor: Chih-Kang Cheng, Hsinchu (TW)

(73) Assignee: Ili Technology Corp., Jhubei, Hsinchu County (TW)

(*) Notice: Subject to any disclaimer, the term of this patent is extended or adjusted under 35 U.S.C. 154(b) by 0 days.

(21) Appl. No.: 12/335,509

(22) Filed: Dec. 15, 2008

(30) Foreign Application Priority Data

Sep. 18, 2008 (TW) ............... 97135756 A (51) Int. Cl.
H03L 5/00 (2006.01)
(52) U.S. Cl. .................... 327/333; 327/62; 327/68
(58) Field of Classification Search .................. 327/62, 327/63, 68, 80, 81, 333
See application file for complete search history.

(56) References Cited

U.S. PATENT DOCUMENTS

| | | | | |
|---|---|---|---|---|
| 5,821,799 A * | 10/1998 | Saripella | ..................... | 327/333 |
| 6,049,243 A * | 4/2000 | Mihara et al. | ................ | 327/333 |
| 6,198,331 B1 * | 3/2001 | Mihara et al. | ................ | 327/333 |
| 6,344,766 B1 * | 2/2002 | Mihara et al. | ................ | 327/333 |
| 6,388,499 B1 * | 5/2002 | Tien et al. | .................... | 327/333 |
| 6,437,627 B1 * | 8/2002 | Tran et al. | .................... | 327/333 |
| 6,563,362 B2 * | 5/2003 | Lambert | ..................... | 327/333 |
| 6,633,192 B2 * | 10/2003 | Tsuchiya | ..................... | 327/333 |
| 6,930,518 B2 * | 8/2005 | Kim et al. | .................... | 327/112 |
| 6,930,622 B2 * | 8/2005 | Brede et al. | .................... | 341/80 |
| 7,026,855 B2 * | 4/2006 | Sueoka et al. | ................ | 327/333 |
| 7,176,740 B2 * | 2/2007 | Tachibana et al. | ........... | 327/333 |
| 7,414,453 B2 * | 8/2008 | Tachibana et al. | ........... | 327/333 |
| 2005/0134355 A1 * | 6/2005 | Maede et al. | ................ | 327/333 |
| 2008/0129365 A1 * | 6/2008 | Chang | ......................... | 327/333 |

* cited by examiner

Primary Examiner—Lincoln Lincoln
Assistant Examiner—William Hernandez
(74) Attorney, Agent, or Firm—Winston Hsu (57) ABSTRACT A signal level shifting circuit, including an input stage circuit and an output signal latching circuit. The input stage circuit receives an input signal, wherein a voltage level of the input signal falls within a first predetermined voltage range. The output signal latching circuit is cascoded with the input stage circuit, and includes: a latching circuit for generating an output signal according to the input signal, wherein a voltage level of the output signal falls within a second predetermined voltage range, and the second predetermined voltage range is different from the first predetermined voltage range; and an activating circuit, coupled to the latching circuit, for selectively enabling or disabling the latching circuit, wherein when a level transition appears to the input signal, the activating circuit disables the latching circuit.

14 Claims, 10 Drawing Sheets

LEVEL SHIFT CIRCUIT

BACKGROUND OF THE INVENTION

1. Field of the Invention

The present invention relates to a level shift circuit, and more particularly to a signal level shifting circuit that is able to turn off a latching circuit in the signal level shifting circuit during a signal level transition period.

2. Description of the Prior Art

Figure 1:
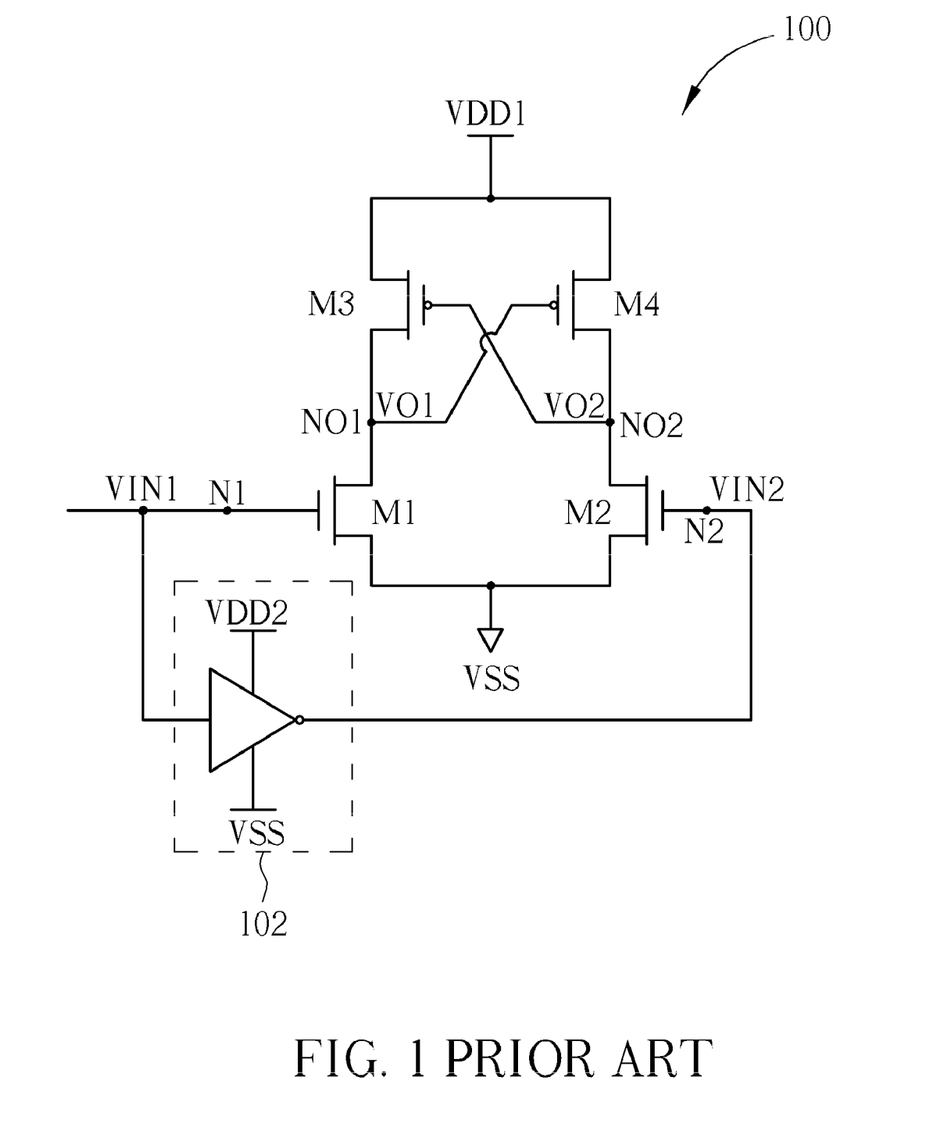
FIG. 1 is a diagram illustrating a conventional voltage level shifting circuit.

The voltage level shifting circuit is one of the most important devices in a liquid crystal display (LCD). The voltage level shifting circuit is utilized to shift a digital signal with relative low voltage level into a digital signal with relative high voltage level to drive the driving circuit in the control system of the liquid crystal display, wherein the driving circuit is operated under the relative high voltage level. Please refer to FIG. 1. FIG. 1 is a diagram illustrating a conventional voltage level shifting circuit 100. The voltage level shifting circuit 100 comprises a differential input pair cascoded to a cross-coupled pair, wherein the differential input pair comprises N type transistors M1, M2, and the cross-coupled pair comprises P type transistors M3, M4. Furthermore, the cross-coupled pair is connected to a supply voltage VDD1, and the differential input pair is connected to a ground voltage VSS as shown in FIG. 1. Furthermore, the voltage level shifting circuit 100 further comprises an inverter 102, which is utilized to generate an input signal VIN2 that has an inversed phase corresponding to the input signal VIN1. The input signal VIN1 is inputted to a gate terminal N1 of the N type transistor M1, and input signal VIN2 is inputted to a gate terminal N2 of the N type transistor M2. Furthermore, the inverter 102 is operated between a supply voltage VDD2 and the ground voltage VSS, wherein the supply voltage VDD1 is higher than the supply voltage VDD2. Accordingly, when the input signal VIN1 is a low voltage level signal, i.e., the ground voltage VSS, the input signal VIN2 is a high voltage level signal, i.e., the supply voltage VDD2, and vice versa. Then, by appropriately modifying the sizes of the N type transistors M1, M2 and the sizes of the P type transistors M3, M4, the voltage level shifting circuit 100 shifts the relative low voltage of the input signals VIN1, VIN2 to the relative high voltage of the output signals VO1, VO2, and outputs the output signals VO1, VO2 at the output terminals NO1, NO2 respectively. More specifically, when the input voltage VIN1 is the ground voltage VSS, and the input voltage VIN2 at the gate terminal N2 is the supply voltage VDD2, then the N type transistor M1 is turned off and the N type transistor M2 is turned on. On the other hand, the P type transistor M3 is turned on, and the P type transistor M4 is turned off. Therefore, the output signal VO1 at the output terminal NO1 is latched to the supply voltage VDD1, and the output signal VO2 at the output terminal NO2 is latched to the ground voltage VSS, and vice versa. However, since the supply voltage VDD1 is higher than the supply voltage VDD2, the N type transistors M1, M2 should be designed to have a large width to increase the turn on current of the N type transistors M1, M2, and the P type transistors M3, M4 should be designed to have a longer length than the length of the N type transistors M1, M2. In addition, since there are a large number of voltage level shifting circuits 100 being used in a driving system of the LCD, the conventional voltage level shifting circuit 100 may occupy a large area in the control system of the LCD, and this consequently increases the cost of the LCD. Therefore, how to reduce the size of a voltage level shifting circuit meanwhile to effectively drive a liquid crystal displaying unit is an urgent problem in the field of LCD.

SUMMARY OF THE INVENTION

One of the objectives of the present invention is to provide a signal level shifting circuit that is able to turn off a latching circuit in the signal level shifting circuit during a signal level transition period.

According to an embodiment of the present invention, a signal level shifting circuit is provided. The signal level shifting circuit comprises an input stage circuit and an output signal latching circuit. The input stage circuit receives an input signal, wherein a voltage level of the input signal falls within a first predetermined voltage range. The output signal latching circuit is cascoded with the input stage circuit, and comprises a latching circuit and an activating circuit. The latching circuit generates an output signal according to the input signal, wherein a voltage level of the output signal falls within a second predetermined voltage range, and the second predetermined voltage range is different from the first predetermined voltage range. The activating circuit is coupled to the latching circuit for selectively enabling or disabling the latching circuit, wherein when a level transition appears to the input signal, the activating circuit disables the latching circuit.

According to another embodiment of the present invention, a signal level shifting circuit is provided. The signal level shifting circuit comprises an input stage circuit, an output signal latching circuit, and a switching circuit. The input stage circuit receives an input signal, wherein a voltage level of the input signal falls within a first predetermined voltage range, and the input stage circuit comprises a first input transistor and a second input transistor. The first input transistor comprises a gate terminal for receiving a first phase input signal of the input signal, and a source terminal coupled to a first reference voltage source. The second input transistor comprises a gate terminal for receiving a second phase input signal of the input signal, and a source terminal coupled to the first reference voltage source, wherein a phase of the second phase input signal is inversed to a phase of the first phase input signal. The output signal latching circuit is cascoded with the input stage circuit, and comprises a latching circuit and a switching circuit. The latching circuit generates an output signal according to the input signal, wherein a voltage level of the output signal falls within a second predetermined voltage range, and the second predetermined voltage range is different from the first predetermined voltage range, and the latching circuit comprises a first latching transistor and a second latching transistor. The first latching transistor comprises a gate terminal coupled to the drain terminal of the second input transistor, and a source terminal coupled to a second reference voltage source. The second latching transistor comprises a gate terminal coupled to the drain terminal of the first input transistor, and a source terminal coupled to the second reference voltage source. The switching circuit comprises a first switching transistor and a second switching transistor. The first switching transistor comprises a gate terminal for receiving an activating control signal, a first connecting terminal coupled to a drain terminal of the first input transistor, and a second connecting terminal coupled to the drain terminal of the first latching transistor, wherein the gate terminal of the first switching transistor does not connect to the first connecting terminal of the first switching transistor. The second switching transistor comprises a gate terminal for receiving the activating control signal, a first connecting terminal coupled to a drain terminal of the second input transistor, and a second connecting terminal coupled to the drain terminal of the second latching transistor, wherein the gate terminal of the second switching transistor does not connect to the first connecting terminal of the second switching transistor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
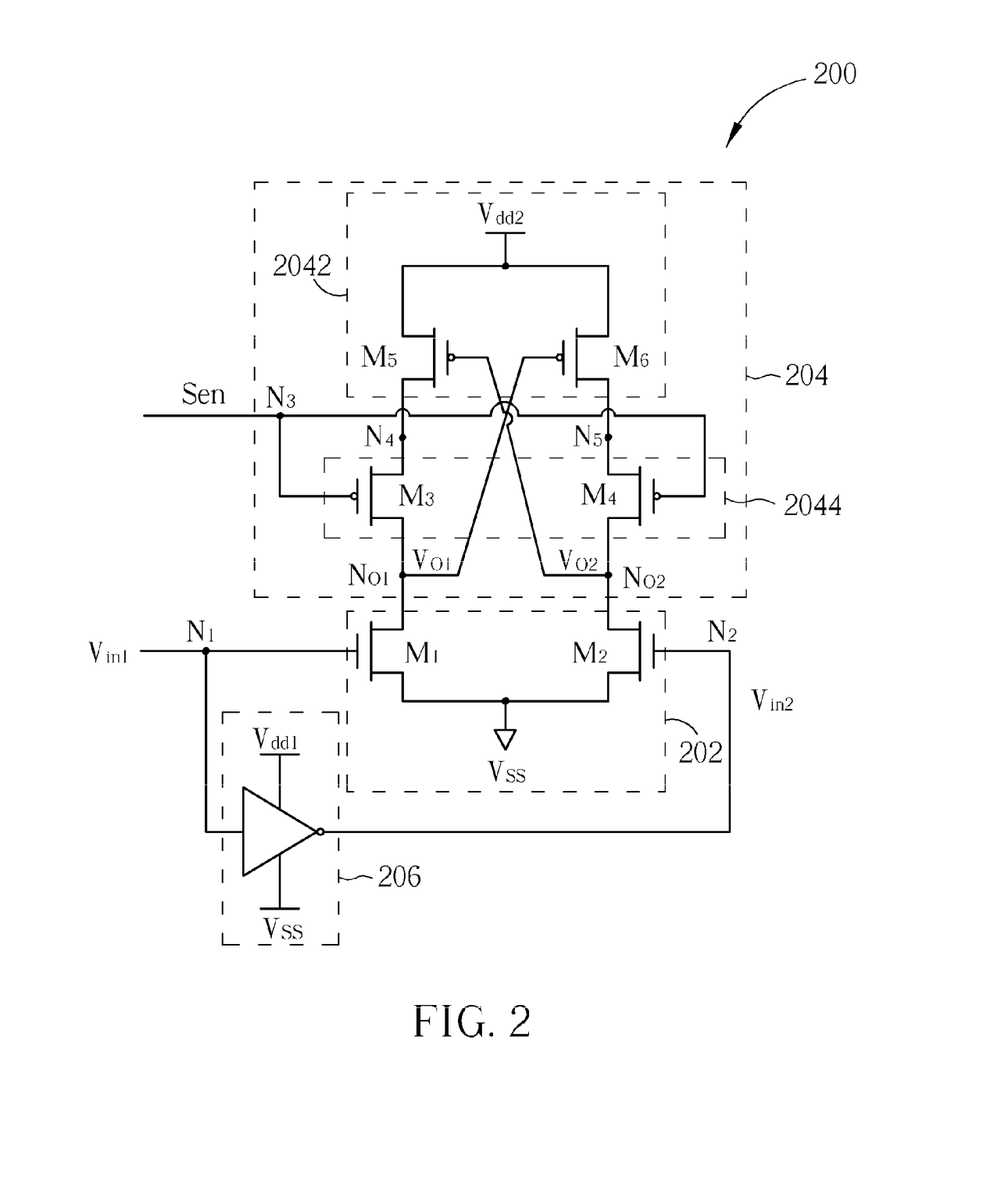
FIG. 2 is a diagram illustrating a signal level shifting circuit according to a first embodiment of the present invention.

Please refer to FIG. 2. FIG. 2 is a diagram illustrating a signal level shifting circuit 200 according to a first embodiment of the present invention. The signal level shifting circuit 200 comprises an input stage circuit 202 and an output signal latching circuit 204, wherein the output signal latching circuit 204 comprises a latching circuit 2042 and an activating circuit 2044. Furthermore, the signal level shifting circuit 200 further comprises an inverter 206, which is utilized to invert an input signal $V_{in1}$ to generate another input signal $V_{in2}$. Furthermore, the inverter 206 is operated between a first supply voltage $V_{dd1}$ and a ground voltage $V_{ss}$. The input stage circuit 202 receives the input signals $V_{in1}$, $V_{in2}$, wherein the input signals $V_{in1}$, $V_{in2}$ fall within a first predetermined voltage range. In this embodiment, the first predetermined voltage range is the range between the first supply voltage $V_{dd1}$ and the ground voltage $V_{ss}$, and the output signal latching circuit 204 is cascoded to the input stage circuit 202. The latching circuit 2042 generates output signals $V_{o1}$, $V_{o2}$ according to the input signals $V_{in1}$, $V_{in2}$, wherein the output signals $V_{o1}$, $V_{o2}$ fall within a second predetermined voltage range, and the second predetermined voltage range is different from the first predetermined voltage range. In this embodiment, the second predetermined voltage range is the range between a second supply voltage $V_{dd2}$ and the ground voltage $V_{ss}$, wherein the voltage level of the second supply voltage $V_{dd2}$ is higher than the voltage level of the first supply voltage $V_{dd1}$. The activating circuit 2044 is coupled to the latching circuit 2042 for selectively enabling or disabling the latching circuit 2042, wherein when the input signals $V_{in1}$, $V_{in2}$ have a level transition, the activating circuit 2044 disables the latching circuit 2042.

Furthermore, in this embodiment, the input stage circuit 202 comprises an N type transistor $M_1$ and an N type transistor $M_2$. The N type transistor $M_1$ comprises a gate terminal $N_1$ for receiving an input signal, i.e., the input signal $V_{in1}$, from the input signals $V_{in1}$, $V_{in2}$, and a source terminal coupled to the ground voltage $V_{ss}$. The N type transistor $M_2$ comprises a gate terminal $N_2$ for receiving another input signal, i.e., the input signal $V_{in2}$, from the input signals $V_{in1}$, $V_{in2}$, and a source terminal coupled to the ground voltage $V_{ss}$. Furthermore, in this embodiment, the phase of the input signal $V_{in1}$ is inversed to the phase of the input signal $V_{in2}$. The activating circuit 2044 comprises a P type transistor $M_3$ and a P type transistor $M_4$. The P type transistor $M_3$ comprises a gate terminal (i.e., terminal $N_3$) for receiving an activating control signal $S_{en}$, and a drain terminal coupled to a drain terminal (i.e., an output terminal $N_{o1}$) of the N type transistor $M_1$. The P type transistor $M_4$ comprises a gate terminal coupled to the terminal $N_3$ for receiving the activating control signal $S_{en}$, and a drain terminal coupled to a drain terminal (i.e., an output terminal $N_{o2}$) of the N type transistor $M_2$. The latching circuit 2042 comprises a P type transistor $M_5$ and a P type transistor $M_6$. The P type transistor $M_5$ comprises a gate terminal coupled to the drain terminal (i.e., the output terminal $N_{o2}$) of the N type transistor $M_2$, a drain terminal $N_4$ coupled to a source terminal of the P type transistor $M_3$, and a source terminal coupled to the second supply voltage $V_{dd2}$. The P type transistor $M_6$ comprises a gate terminal coupled to the drain terminal (i.e., the output terminal $N_{o1}$) of the N type transistor $M_1$, a drain terminal $N_5$ coupled to a source terminal of the P type transistor $M_4$, and a source terminal coupled to the second supply voltage $V_{dd2}$.

Figure 3:
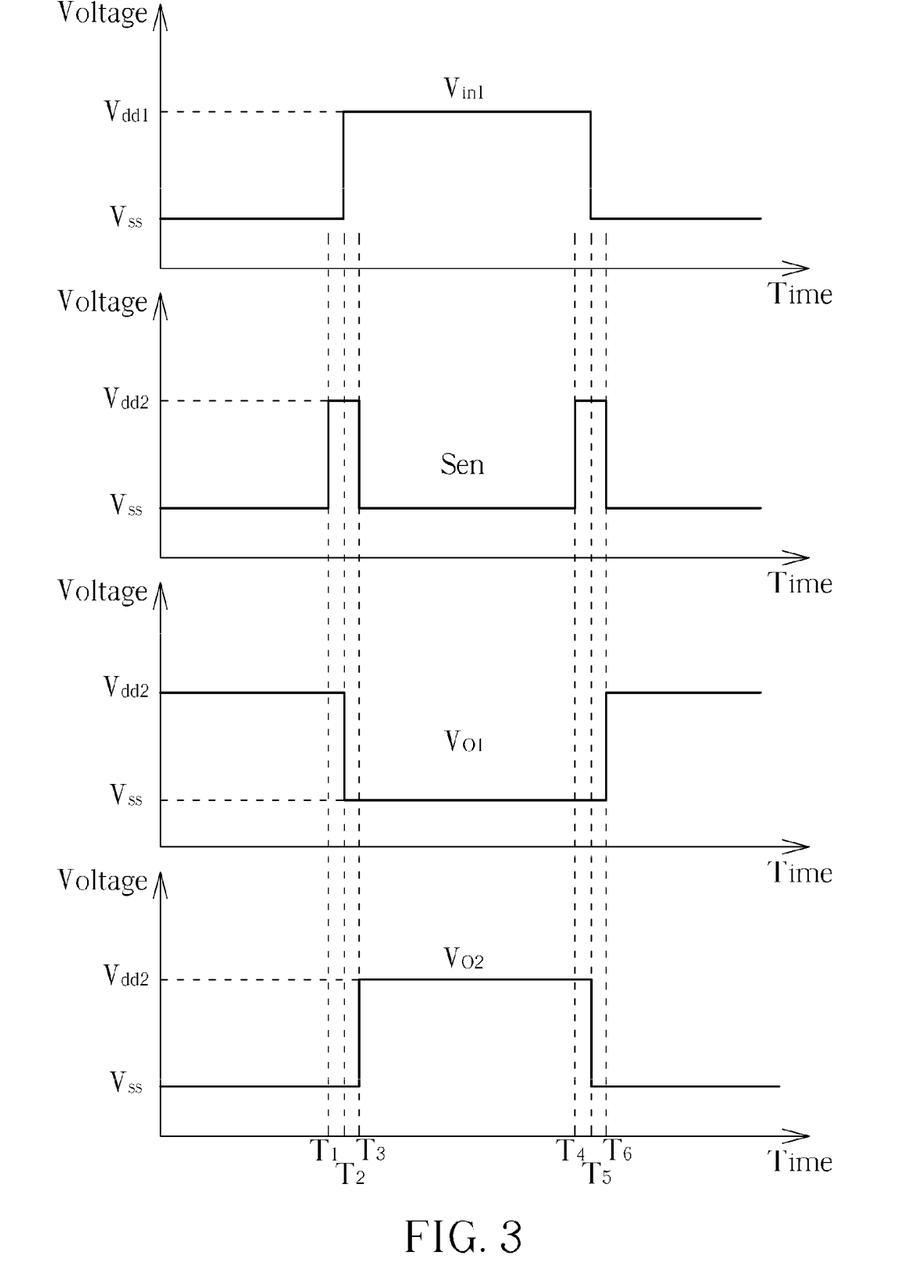
FIG. 3 is a timing diagram illustrating an input signal, an activating control signal, and output signals of the signal level shifting circuit as shown in FIG. 2.

Please refer to FIG. 3. FIG. 3 is a timing diagram illustrating the input signal $V_{in1}$, the activating control signal $S_{en}$, and the output signals $V_{o1}$, $V_{o2}$ of the signal level shifting circuit 200 as shown in FIG. 2. According to the embodiment of the present invention, the activating circuit 2044 disables the latching circuit 2042 before the level transition appears to the input signal $V_{in1}$, and enables the latching circuit 2042 after the level transition appears to the input signal $V_{in1}$. More specifically, when the input signal $V_{in1}$ transits to the first supply voltage $V_{dd1}$ from the ground voltage $V_{ss}$ at a time $T_2$, the activating control signal $S_{en}$ transits to the second supply voltage $V_{dd2}$ from the ground voltage $V_{ss}$ at a time $T_1$ beforehand. Accordingly, when the activating control signal $S_{en}$ is the second supply voltage $V_{dd2}$, the P type transistors $M_3$, $M_4$ are turned off, and then the latching path of the latching circuit 2042 is opened and the latching circuit 2042 can not perform its latching operation. Furthermore, the activating circuit 2044 also opens the current path between the second supply voltage $V_{dd2}$ and the output terminal $N_{o1}$, $N_{o2}$ at the same time. According to the embodiment of the present invention, since the voltage level of the input signal $V_{in1}$ is at the ground voltage $V_{ss}$ before the time $T_1$, the voltage levels of the output signals $V_{o1}$, $V_{o2}$ are the second supply voltage $V_{dd2}$ and the ground voltage $V_{ss}$ respectively. When the input signal $V_{in1}$ transits to the first supply voltage $V_{dd1}$ from the ground voltage $V_{ss}$ at the time $T_2$, meanwhile the current path between the second supply voltage $V_{dd2}$ and the output terminal $N_{o1}$ is opened (i.e., off) by the P type transistor $M_3$, and the N type transistor $M_1$ discharges the output signal $V_{o1}$ at the output terminal $N_{o1}$ to the ground voltage $V_{ss}$ from the second supply voltage $V_{dd2}$ at the time $T_2$. On the other hand, since the current path between the second supply voltage $V_{dd2}$ and the output terminal $N_{o2}$ is opened (i.e., off) by the P type transistor $M_4$, the output signal $V_{o2}$ at the output terminal $N_{o2}$ may not be charged to the second supply voltage $V_{dd2}$ right at the time $T_2$, but may keep at the ground voltage $V_{ss}$ temporally. Then, when the activating control signal $S_{en}$ transits to the ground voltage $V_{ss}$ at a time $T_3$, the current path between the second supply voltage $V_{dd2}$ and the output terminal $N_{o2}$ is re-established as the P type transistors $M_3$, $M_4$ are enabled again. Then, the output signal $V_{o2}$ at the output terminal $N_{o2}$ may be charged to the second supply voltage $V_{dd2}$ at the time $T_3$. In other words, when the activating control signal $S_{en}$ transits to the ground voltage $V_{ss}$ at the time $T_3$, the latching circuit 2042 performs a latching operation upon the output signals $V_{o1}$, $V_{o2}$ at the output terminals $N_{o1}$, $N_{o2}$ respectively in cooperation with the input stage circuit 202 to discharge the output signal $V_{o1}$ to the ground voltage $V_{ss}$ and to charge the output signal $V_{o2}$ to the second supply voltage $V_{dd2}$.

Similarly, when the input signal $V_{in1}$ transits to the ground voltage $V_{ss}$ from the first supply voltage $V_{dd1}$ at a time $T_5$, the activating control signal $S_{en}$ transits to the second supply voltage $V_{dd2}$ from the ground voltage $V_{ss}$ at a time $T_4$ beforehand. Accordingly, when the activating control signal $S_{en}$ is the second supply voltage $V_{dd2}$, the P type transistors $M_3$, $M_4$ are turned off, then the latching path of the latching circuit 2042 is opened and the latching circuit 2042 can not perform its latching operation. Furthermore, the activating circuit 2044 also opens the current path between the second supply voltage $V_{dd2}$ and the output terminal $N_{o1}$, $N_{o2}$ at the same time. According to FIG. 3 of the present invention, since the voltage level of the input signal $V_{in1}$ is at the first supply voltage $V_{dd1}$ before the time $T_5$, the voltage levels of the output signals $V_{o1}$, $V_{o2}$ are the ground voltage $V_{ss}$ and the second supply voltage $V_{dd2}$ respectively. When the input signal $V_{in1}$ transits to the ground voltage $V_{ss}$ from the first supply voltage $V_{dd1}$ at the time $T_5$, meanwhile the current path between the second supply voltage $V_{dd2}$ and the output terminal $N_{o2}$ is opened (i.e., off) by the P type transistor $M_4$, and the N type transistor $M_2$ discharges the output signal $V_{o2}$ at the output terminal $N_{o2}$ to the ground voltage $V_{ss}$ from the second supply voltage $V_{dd2}$ at the time $T_5$. On the other hand, since the current path between the second supply voltage $V_{dd2}$ and the output terminal $N_{o1}$ is opened (i.e., off) by the P type transistor $M_3$, the output signal $V_{o1}$ at the output terminal $N_{o1}$ may not be charged to the second supply voltage $V_{dd2}$ right at the time $T_5$, but may keep at the ground voltage $V_{ss}$ temporally. Then, when the activating control signal $S_{en}$ transits to the ground voltage $V_{ss}$ at a time $T_6$, the current path between the second supply voltage $V_{dd2}$ and the output terminal $N_{o1}$ is re-established as the P type transistors $M_3$, $M_4$ are enabled again. Then, the output signal $V_{o1}$ at the output terminal $N_{o1}$ may be charged to the second supply voltage $V_{dd2}$ at the time $T_6$. In other words, when the activating control signal $S_{en}$ transits to the ground voltage $V_{ss}$ at the time $T_6$, the latching circuit 2042 performs a latching operation upon the output signals $V_{o1}$, $V_{o2}$ at the output terminals $N_{o1}$, $N_{o2}$ respectively in cooperation with the input stage circuit 202 to charge the output signal $V_{o1}$ to the second supply voltage $V_{dd2}$ and to discharge the output signal $V_{o2}$ to the ground voltage $V_{ss}$.

According to the disclosed operation of the above-mentioned embodiments, the latching path of the latching circuit 2042 is opened when the level transition is occurred to the input signals $V_{in1}$, $V_{in2}$. Therefore, the input stage circuit 202 does not generate a large current to switch the voltage levels of the output signals $V_{o1}$, $V_{o2}$ at the output terminals $N_{o1}$, $N_{o2}$ respectively during the level transition, but to generate a relative small current to discharge one of the output signals at the output terminals $N_{o1}$, $N_{o2}$. Accordingly, the level transition of the output signals $V_{o1}$, $V_{o2}$ can be accomplished by the relative small current. On the other hand, when the activating control signal $S_{en}$ transits to the ground voltage $V_{ss}$, the latching circuit 2042 latches the other output signal of the output signals $V_{o1}$, $V_{o2}$ to the other voltage level. Therefore, the signal level shifting circuit 200 not only increases the transition speed of the output signals $V_{o1}$, $V_{o2}$, but also the sizes of the N type transistors $M_1$, $M_2$ of the input stage circuit 202 and the P type transistors $M_5$, $M_6$ of the latching circuit 2042 can be reduced, i.e., implemented in smaller width and length, which can reduce the cost of the signal level shifting circuit 200. On the other hand, since the current path between the second supply voltage $V_{dd2}$ and the ground voltage $V_{ss}$ is opened during the level transition of the input signals $V_{in1}$, $V_{in2}$, the signal level shifting circuit 200 of the present invention also has the advantage of reducing the leakage current from the second supply voltage $V_{dd2}$ to the ground voltage $V_{ss}$.

Figure 4:
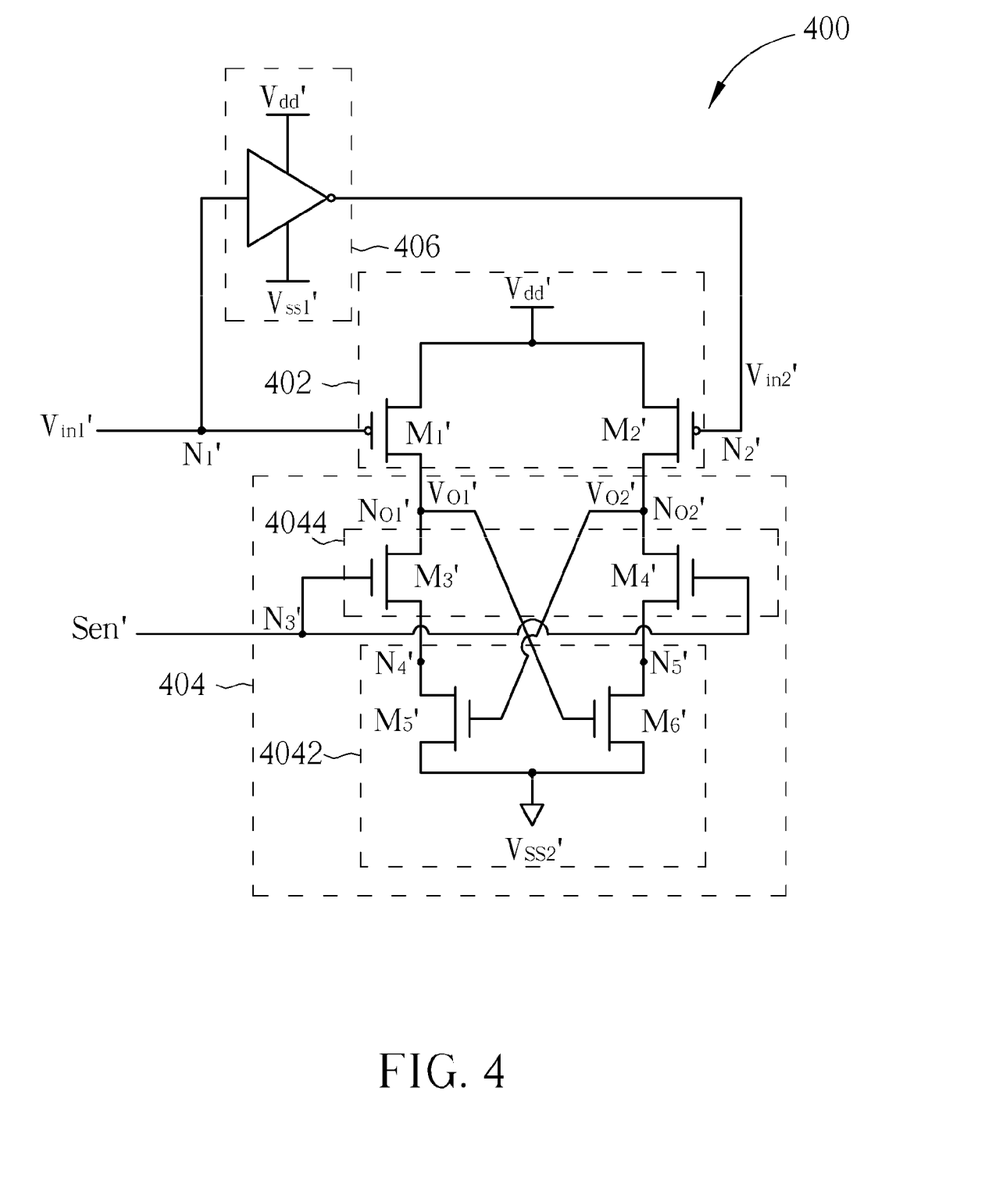
FIG. 4 is a diagram illustrating the signal level shifting circuit according to a second embodiment of the present invention.

Please refer to FIG. 4. FIG. 4 is a diagram illustrating a signal level shifting circuit 400 according to a second embodiment of the present invention. The signal level shifting circuit 400 comprises an input stage circuit 402 and an output signal latching circuit 404, wherein the output signal latching circuit 404 comprises a latching circuit 4042 and an activating circuit 4044. Furthermore, the signal level shifting circuit 400 further comprises an inverter 406, which is utilized to invert an input signal $V_{in1}'$ to generate another input signal $V_{in2}'$. Furthermore, the inverter 406 is operated between a supply voltage $V_{dd}'$ and a first ground voltage $V_{ss1}'$. The input stage circuit 402 receives the input signals $V_{in1}'$, $V_{in2}'$, wherein the input signals $V_{in1}'$, $V_{in2}'$ fall within a first predetermined voltage range. In this embodiment, the first predetermined voltage range is the range between the supply voltage $V_{dd}'$ and the first ground voltage $V_{ss1}'$, and the output signal latching circuit 404 is cascoded to the input stage circuit 402. The latching circuit 4042 generates output signals $V_{o1}'$, $V_{o2}'$ according to the input signals $V_{in1}'$, $V_{in2}'$, wherein the output signals $V_{o1}'$, $V_{o2}'$ fall within a second predetermined voltage range, and the second predetermined voltage range is different from the first predetermined voltage range. In this embodiment, the second predetermined voltage range is the range between the supply voltage $V_{dd}'$ and a second ground voltage $V_{ss2}'$, wherein the voltage level of the second ground voltage $V_{ss2}'$ is lower than the voltage level of the first ground voltage $V_{ss1}'$. The activating circuit 4044 is coupled to the latching circuit 4042 for selectively enabling or disabling the latching circuit 4042, wherein when the input signals $V_{in1}'$, $V_{in2}'$ have a level transition, the activating circuit 4044 disables the latching circuit 4042.

Furthermore, in this embodiment, the input stage circuit 402 comprises a P type transistor $M_1'$ and a P type transistor $M_2'$. The P type transistor $M_1'$ comprises a gate terminal $N_1'$ for receiving an input signal, i.e., the input signal $V_{in1}'$, from the input signals $V_{in1}'$, $V_{in2}'$, and a source terminal coupled to the supply voltage $V_{dd}'$. The P type transistor $M_2'$ comprises a gate terminal $N_2'$ for receiving another input signal, i.e., the input signal $V_{in2}'$, from the input signals $V_{in1}'$, $V_{in2}'$, and a source terminal coupled to the supply voltage $V_{dd}'$. Furthermore, in this embodiment, the phase of the input signal $V_{in1}'$ is inversed to the phase of the input signal $V_{in2}'$. The activating circuit 4044 comprises an N type transistor $M_3'$ and an N type transistor $M_4'$. The N type transistor $M_3'$ comprises a gate terminal (i.e., terminal $N_3'$) for receiving an activating control signal $S_{en}'$, and a drain terminal coupled to a drain terminal (i.e., an output terminal $N_{o1}'$) of the P type transistor $M_1'$. The N type transistor $M_4'$ comprises a gate terminal coupled to the terminal $N_3'$ for receiving the activating control signal $S_{en}'$, and a drain terminal coupled to a drain terminal (i.e., an output terminal $N_{o2}'$) of the P type transistor $M_2'$. The latching circuit 4042 comprises an N type transistor $M_5'$ and an N type transistor $M_6'$. The N type transistor $M_5'$ comprises a gate terminal coupled to the drain terminal (i.e., the output terminal $N_{o2}'$) of the P type transistor $M_2'$, a drain terminal $N_4'$ coupled to a source terminal of the N type transistor $M_3'$, and a source terminal coupled to the second ground voltage $V_{ss2}'$. The N type transistor $M_6'$ comprises a gate terminal coupled to the drain terminal (i.e., the output terminal $N_{o1}'$) of the P type transistor $M_1'$, a drain terminal $N_5'$ coupled to a source terminal of the N type transistor $M_4'$, and a source terminal coupled to the second ground voltage $V_{ss2}'$.

Figure 5:
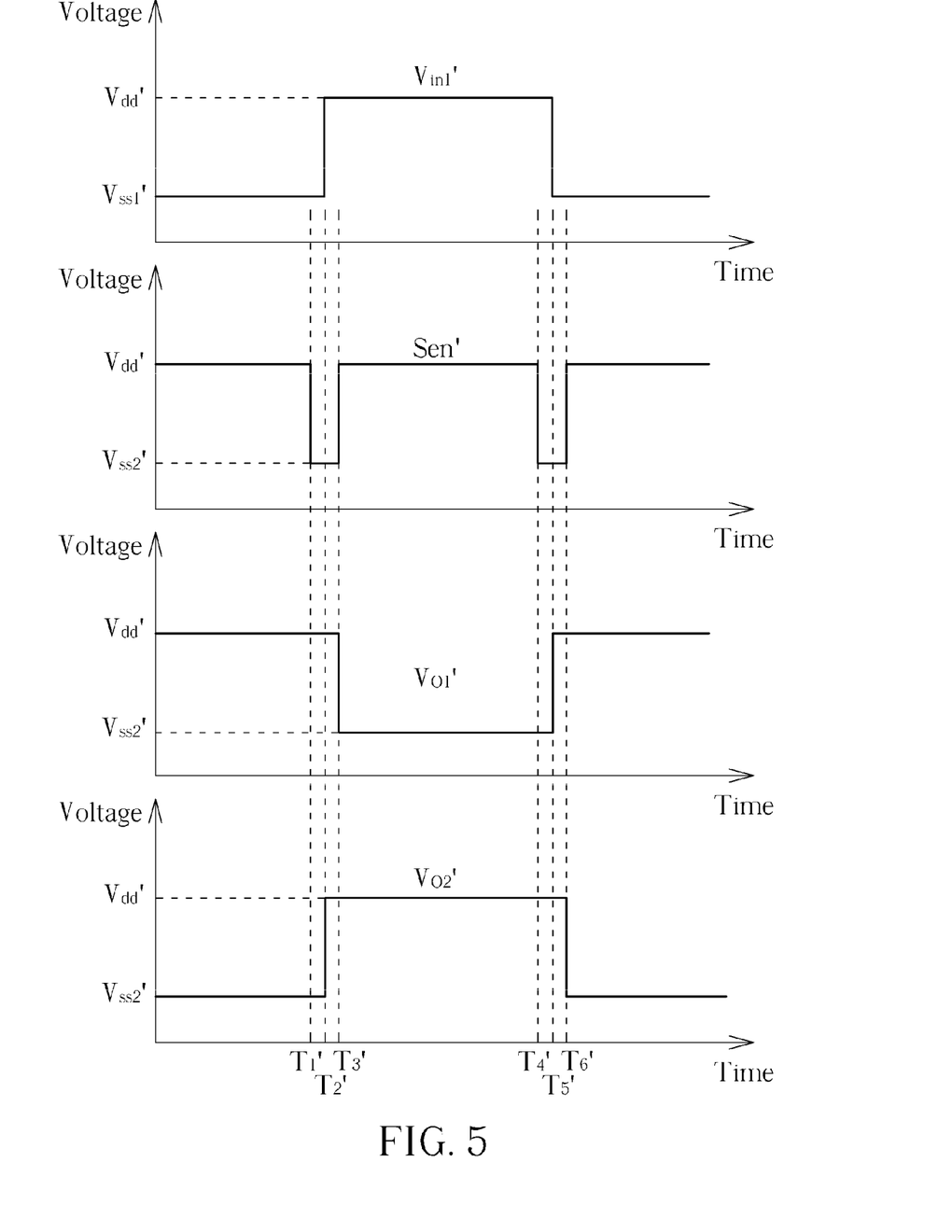
FIG. 5 is a timing diagram illustrating the input signal, the activating control signal, and the output signals of the signal level shifting circuit as shown in FIG. 4.

Please refer to FIG. 5. FIG. 5 is a timing diagram illustrating the input signal $V_{in1}'$, the activating control signal $S_{en}'$, the output signals $V_{o1}'$, $V_{o2}'$ of the signal level shifting circuit 400 as shown in FIG. 4. According to the embodiment of the present invention, the activating circuit 4044 disables the latching circuit 4042 before the level transition appears to the input signal $V_{in1}'$, and enables the latching circuit 4042 after the level transition appears to the input signal $V_{in1}'$. More specifically, when the input signal $V_{in1}'$ transits to the supply voltage $V_{dd}'$ from the first ground voltage $V_{ss1}'$ at a time $T_2'$, the activating control signal $S_{en}'$ transits to the second ground voltage $V_{ss2}'$ from the supply voltage $V_{dd}'$ at a time $T_1'$ beforehand. Accordingly, when the activating control signal $S_{en}'$ is the second ground voltage $V_{ss2}'$, the N type transistors $M_3'$, $M_4'$ are turned off, and then the latching path of the latching circuit 4042 is opened and the latching circuit 4042 can not perform its latching operation. Furthermore, the activating circuit 4044 also opens the current path between the second ground voltage $V_{ss2}'$ and the output terminals $N_{o1}'$, $N_{o2}'$ at the same time. According to the embodiment of the present invention, since the voltage level of the input signal $V_{in1}'$ is at the first ground voltage $V_{ss1}'$ before the time $T_1'$, the voltage levels of the output signals $V_{o1}'$, $V_{o2}'$ are the supply voltage $V_{dd}'$ and the second ground voltage $V_{ss2}'$ respectively. When the input signal $V_{in1}'$ transits to the supply voltage $V_{dd}'$ from the first ground voltage $V_{ss1}'$ at the time $T_2'$, meanwhile the current path between the second ground voltage $V_{ss2}'$ and the output terminal $N_{o2}'$ is opened (i.e., off) by the N type transistor $M_4'$, and the P type transistor $M_2'$ charges the output signal $V_{o2}'$ at the output terminal $N_{o2}'$ to the supply voltage $V_{dd}'$ from the second ground voltage $V_{ss2}'$ at the time $T_2'$. On the other hand, since the current path between the second ground voltage $V_{ss2}'$ and the output terminal $N_{o1}'$ is opened (i.e., off) by the N type transistor $M_3'$, the output signal $V_{o1}'$ at the output terminal $N_{o1}'$ may not be discharged to the second ground voltage $V_{ss2}'$ right at the time $T_2'$, but may keep at the supply voltage $V_{dd}'$ temporally. Then, when the activating control signal $S_{en}'$ transits to the supply voltage $V_{dd}'$ at a time $T_3'$, the current path between the second ground voltage $V_{ss2}'$ and the output terminal $N_{o1}'$ is re-established as the N type transistors $M_3'$, $M_4'$ are enabled again. Then, the output signal $V_{o1}'$ at the output terminal $N_{o1}'$ may be discharged to the second ground voltage $V_{ss2}'$ at the time $T_3'$. In other words, when the activating control signal $S_{en}'$ transits to the supply voltage $V_{dd}'$ at the time $T_3'$, the latching circuit 4042 performs a latching operation upon the output signals $V_{o1}'$, $V_{o2}'$ at the output terminals $N_{o1}'$, $N_{o2}'$ respectively in cooperation with the input stage circuit 402 to charge the output signal $V_{o2}'$ to the supply voltage $V_{dd}'$ and to discharge the output signal $V_{o1}'$ to the second ground voltage $V_{ss2}'$.

Similarly, when the input signal $V_{in1}'$ transits to the first ground voltage $V_{ss1}'$ from the supply voltage $V_{dd}'$ at a time $T_5'$, the activating control signal $S_{en}'$ transits to the second ground voltage $V_{ss2}'$ from the supply voltage $V_{dd}'$ at a time $T_4'$ beforehand. Accordingly, when the activating control signal $S_{en}'$ is the second ground voltage $V_{ss2}'$, the N type transistors $M_3'$, $M_4'$ are turned off, then the latching path of the latching circuit 4042 is opened and the latching circuit 4042 can not perform its latching operation. Furthermore, the activating circuit 4044 also opens the current path between the second ground voltage $V_{ss2}'$ and the output terminals $N_{o1}'$, $N_{o2}'$ at the same time. According to FIG. 5 of the present invention, since the voltage level of the input signal $V_{in1}'$ is at the supply voltage $V_{dd}'$ before the time $T_5'$, the voltage levels of the output signals $V_{o1}'$, $V_{o2}'$ are the second ground voltage $V_{ss2}'$ and the supply voltage $V_{dd}'$ respectively. When the input signal $V_{in1}'$ transits to the first ground voltage $V_{ss1}'$ from the supply voltage $V_{dd}'$ at the time $T_5'$, meanwhile the current path between the second ground voltage $V_{ss2}'$ and the output terminal $N_{o1}'$ is opened (i.e., off) by the N type transistor $M_3'$, and the P type transistor $M_1'$ charges the output signal $V_{o1}'$ at the output terminal $N_{o1}'$ to the supply voltage $V_{dd}'$ from the second ground voltage $V_{ss2}'$ at the time $T_5'$. On the other hand, since the current path between the second ground voltage $V_{ss2}'$ and the output terminal $N_{o2}'$ is opened (i.e., off) by the N type transistor $M_4'$, the output signal $V_{o2}'$ at the output terminal $N_{o2}'$ may not be discharged to the second ground voltage $V_{ss2}'$ right at the time $T_5'$, but may keep at the supply voltage $V_{dd}'$ temporarily. Then, when the activating control signal $S_{en}'$ transits to the supply voltage $V_{dd}'$ at a time $T_6'$, the current path between the second ground voltage $V_{ss2}'$ and the output terminal $N_{o2}'$ is re-established as the N type transistors $M_3'$, $M_4'$ are enabled again. Then, the output signal $V_{o2}'$ at the output terminal $N_{o2}'$ may be discharged to the second ground voltage $V_{ss2}'$ at the time $T_6'$. In other words, when the activating control signal $S_{en}'$ transits to the supply voltage $V_{dd}'$ at the time $T_6'$, the latching circuit 4042 performs a latching operation upon the output signals $V_{o1}'$, $V_{o2}'$ at the output terminals $N_{o1}'$, $N_{o2}'$ respectively in cooperation with the input stage circuit 402 to discharge the output signal $V_{o2}'$ to the second ground voltage $V_{ss2}'$ and to charge the output signal $V_{o1}'$ to the supply voltage $V_{dd}'$.

Please note that, after reading the disclosure of the signal level shifting circuit 400 of the second embodiment of the present invention, those skilled in this art will readily understand that the second embodiment also has the advantages of small size, fast transition speed, and low leakage current, thus the detailed description is omitted here for brevity.

Figure 6:
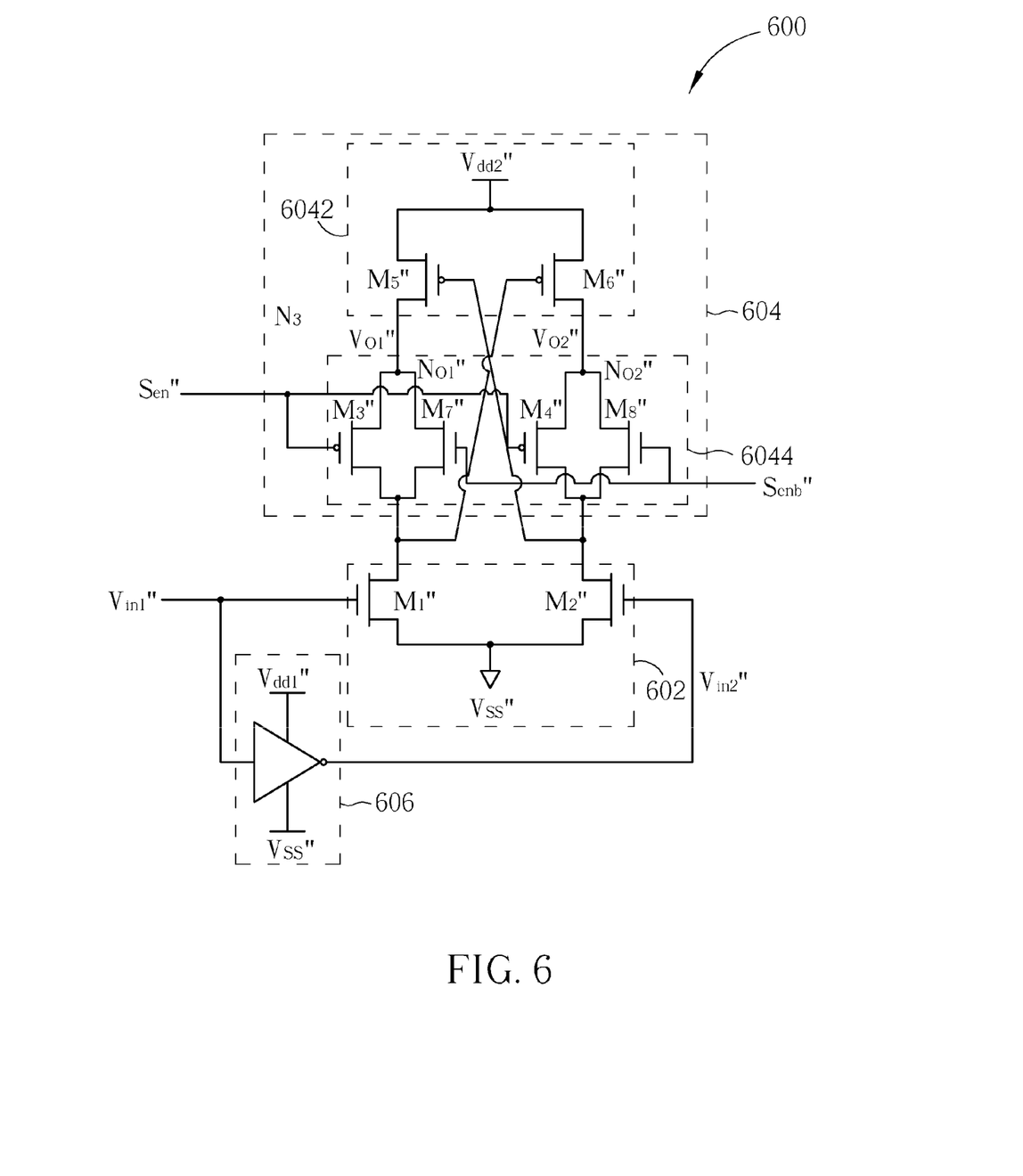
FIG. 6 is a diagram illustrating the signal level shifting circuit according to a third embodiment of the present invention.

Please refer to FIG. 6. FIG. 6 is a diagram illustrating a signal level shifting circuit 600 according to a third embodiment of the present invention. The signal level shifting circuit 600 comprises an input stage circuit 602 and an output signal latching circuit 604, wherein the output signal latching circuit 604 comprises a latching circuit 6042 and an activating circuit 6044. Furthermore, the signal level shifting circuit 600 further comprises an inverter 606, which is utilized to invert an input signal $V_{in1}"$ to generate another input signal $V_{in2}"$. Furthermore, the inverter 606 is operated between a first supply voltage $V_{dd1}"$ and a ground voltage $V_{ss}"$. The input stage circuit 602 receives the input signals $V_{in1}"$, $V_{in2}"$, wherein the input signals $V_{in1}"$, $V_{in2}"$ fall within a first predetermined voltage range. In this embodiment, the first predetermined voltage range is the range between the first supply voltage $V_{dd1}"$ and the ground voltage $V_{ss}"$, and the output signal latching circuit 604 is cascoded to the input stage circuit 602. The latching circuit 6042 generates output signals $V_{o1}"$, $V_{o2}"$ according to the input signals $V_{in1}"$, $V_{in2}"$, wherein the output signals $V_{o1}"$, $V_{o2}"$ fall within a second predetermined voltage range, and the second predetermined voltage range is different from the first predetermined voltage range. In this embodiment, the second predetermined voltage range is the range between a second supply voltage $V_{dd2}"$ and the ground voltage $V_{ss}"$, wherein the voltage level of the second supply voltage $V_{dd2}"$ is higher than the voltage level of the first supply voltage $V_{dd1}"$. The activating circuit 6044 is coupled to the latching circuit 6042 for selectively enabling or disabling the latching circuit 6042, wherein when the input signals $V_{in1}"$, $V_{in2}"$ have a level transition, the activating circuit 6044 disables the latching circuit 6042.

Figure 7:
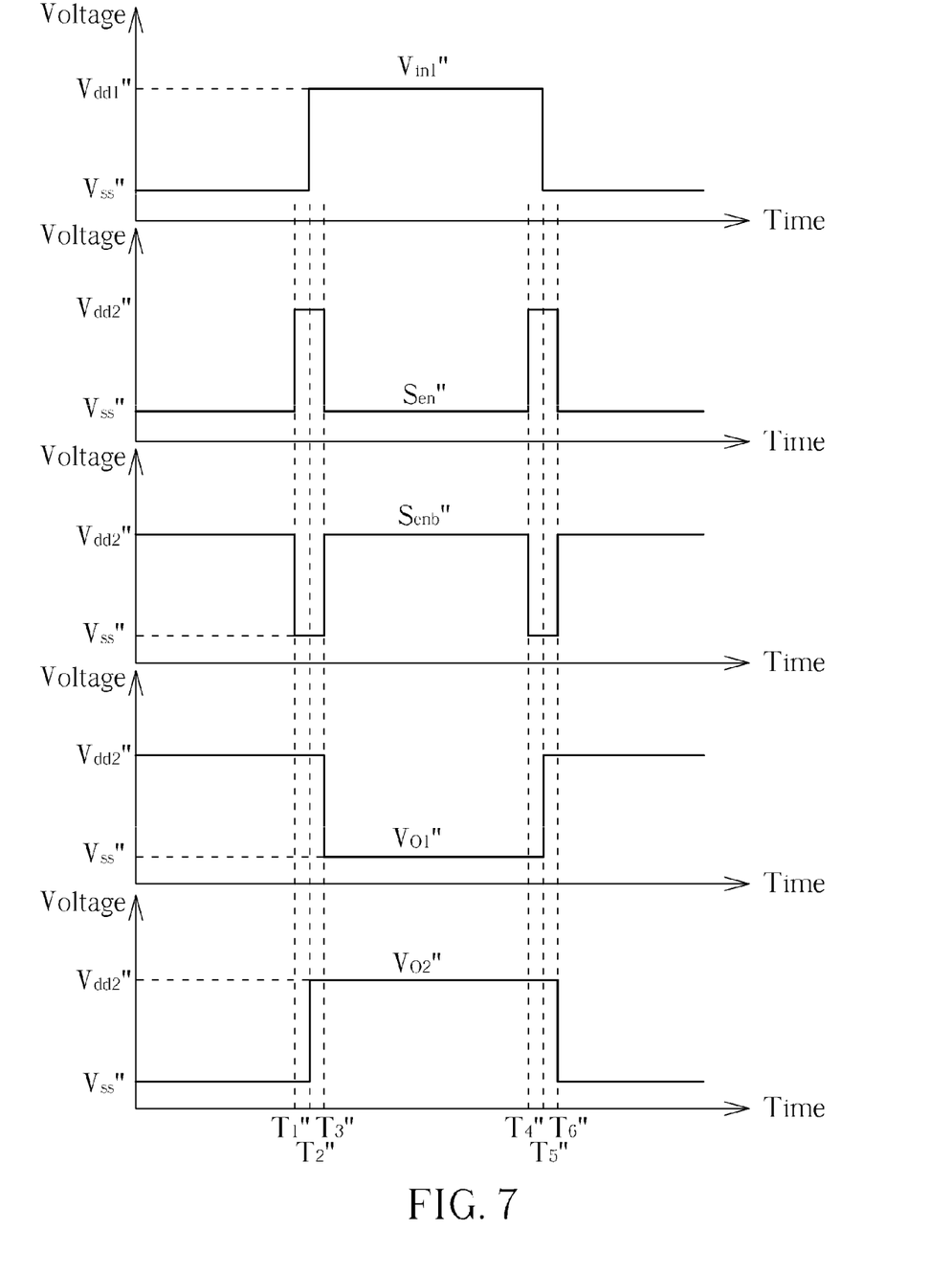
FIG. 7 is a timing diagram illustrating the input signal, the activating control signal, the inversed activating control, and the output signals of the signal level shifting circuit 600 as shown in FIG. 6.

Comparing to the signal level shifting circuit 200 as shown in FIG. 2, two transmission gates are utilized to implement the activating circuit 6044 of the signal level shifting circuit 600 as shown in FIG. 6. Therefore, except for the P type transistors $M_3"$, $M_4"$, the activating circuit 6044 further comprises the N type transistors $M_7"$, $M_8"$, wherein the gate terminals of the P type transistors $M_3"$, $M_4"$ are coupled to the activating control signal $S_{en}"$, and the gate terminals of the N type transistors $M_7"$, $M_8"$ are coupled to an inversed activating control signal $S_{enb}"$, which has an inversed phase to the activating control signal $S_{en}"$. On the other hand, according to the third embodiment of the present invention, the output signal $V_{o1}"$ is outputted at a source terminal (i.e., an output terminal $N_{o1}"$) of the P type transistor $M_3"$, and the output signal $V_{o2}"$ is outputted at a source terminal (i.e., an output terminal $N_{o2}"$) of the P type transistor $M_4"$, which has an objective to maximize the signal swing between the output signal $V_{o1}"$ and the output signal $V_{o2}"$, i.e., $V_{dd2}"-V_{ss}"$. Please refer to FIG. 7. FIG. 7 is a timing diagram illustrating the input signal $V_{in1}"$, the activating control signal $S_{en}"$, the inversed activating control $S_{enb}"$, and the output signals $V_{o1}"$, $V_{o2}"$ of the signal level shifting circuit 600 as shown in FIG. 6. Similar to the above-mentioned first and second embodiments, the activating circuit 6044 disables the latching circuit 6042 before the level transition appears to the input signal $V_{in1}"$, and enables the latching circuit 6042 after the level transition appears to the input signal $V_{in1}"$. More specifically, when the input signal $V_{in1}"$ transits to the first supply voltage $V_{dd1}"$ from the ground voltage $V_{ss}"$ at a time $T_2"$, the activating control signal $S_{en}"$ transits to the second supply voltage $V_{dd2}"$ from the ground voltage $V_{ss}"$ at a time $T_1"$ beforehand, and the inversed activating control signal $S_{enb}"$ transits to the ground voltage $V_{ss}"$ from the second supply voltage $V_{dd2}"$ at the time $T_1"$ beforehand. Accordingly, the latching path of the latching circuit 6042 is opened and the latching circuit 6042 can not perform its latching operation, such that the N type transistors $M_1"$, $M_2"$ of the input stage circuit 602 transit the output signals $V_{o1}"$, $V_{o2}"$ by a relative low current. On the contrary, when the input signal $V_{in1}"$ transits to the ground voltage $V_{ss}"$ from the first supply voltage $V_{dd1}"$ at a time $T_5"$, the activating control signal $S_{en}"$ transits to the second supply voltage $V_{dd2}"$ from the ground voltage $V_{ss}"$ at a time $T_4"$ beforehand, and the inversed activating control signal $S_{enb}"$ transits to the ground voltage $V_{ss}"$ from the second supply voltage $V_{dd2}"$ at the time $T_4"$ beforehand. Similarly, the latching path of the latching circuit 6042 is opened and the latching circuit 6042 can not perform its latching operation, such that the N type transistors $M_1"$, $M_2"$ of the input stage circuit 602 transit the output signals $V_{o1}"$, $V_{o2}"$ by a relative low current. Please note that, those skilled in this art will readily understand the detailed operation of the signal level shifting circuit 600 as shown in FIG. 6 after reading the disclosures of the first and the second embodiments of the present invention, thus the detailed description of the signal level shifting circuit 600 is omitted here for brevity.

Figure 8:
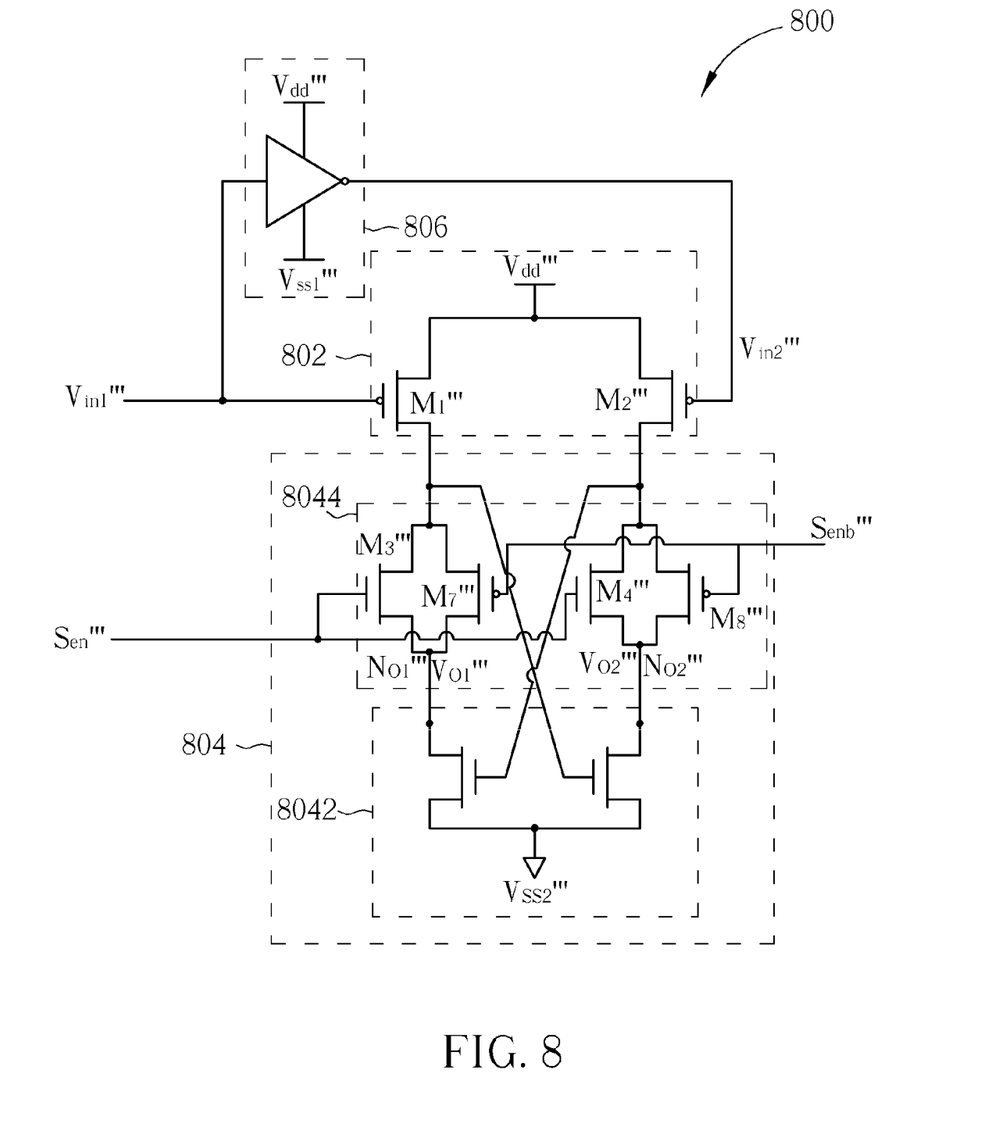
FIG. 8 is a diagram illustrating the signal level shifting circuit according to a fourth embodiment of the present invention.

Please refer to FIG. 8. FIG. 8 is a diagram illustrating a signal level shifting circuit 800 according to a fourth embodiment of the present invention. The signal level shifting circuit 800 comprises an input stage circuit 802 and an output signal latching circuit 804, wherein the output signal latching circuit 804 comprises a latching circuit 8042 and an activating circuit 8044. Furthermore, the signal level shifting circuit 800 further comprises an inverter 806, which is utilized to invert an input signal $V_{in1}'''$ to generate another input signal $V_{in2}'''$. Furthermore, the inverter 806 is operated between a supply voltage $V_{dd}'''$ and a first ground voltage $V_{ss1}'''$. The input stage circuit 802 receives the input signals $V_{in1}'''$, $V_{in2}'''$, wherein the input signals $V_{in1}'''$, $V_{in2}'''$ fall within a first predetermined voltage range. In this embodiment, the first predetermined voltage range is the range between the supply voltage $V_{dd}'''$ and the first ground voltage $V_{ss1}'''$, and the output signal latching circuit 804 is cascoded to the input stage circuit 802. The latching circuit 8042 generates output signals $V_{o1}'''$, $V_{o2}'''$ according to the input signals $V_{in1}'''$, $V_{in2}'''$, wherein the output signals $V_{o1}'''$, $V_{o2}'''$ fall within a second predetermined voltage range, and the second predetermined voltage range is different from the first predetermined voltage range. In this embodiment, the second predetermined voltage range is the range between the supply voltage $V_{dd}'''$ and a second ground voltage $V_{ss2}'''$, wherein the voltage level of the second ground voltage $V_{ss2}'''$ is lower than the voltage level of the first ground voltage $V_{ss1}'''$. The activating circuit 8044 is coupled to the latching circuit 8042 for selectively enabling or disabling the latching circuit 8042, wherein when the input signals $V_{in1}'''$, $V_{in2}'''$ have a level transition, the activating circuit 8044 disables the latching circuit 8042.

Figure 9:
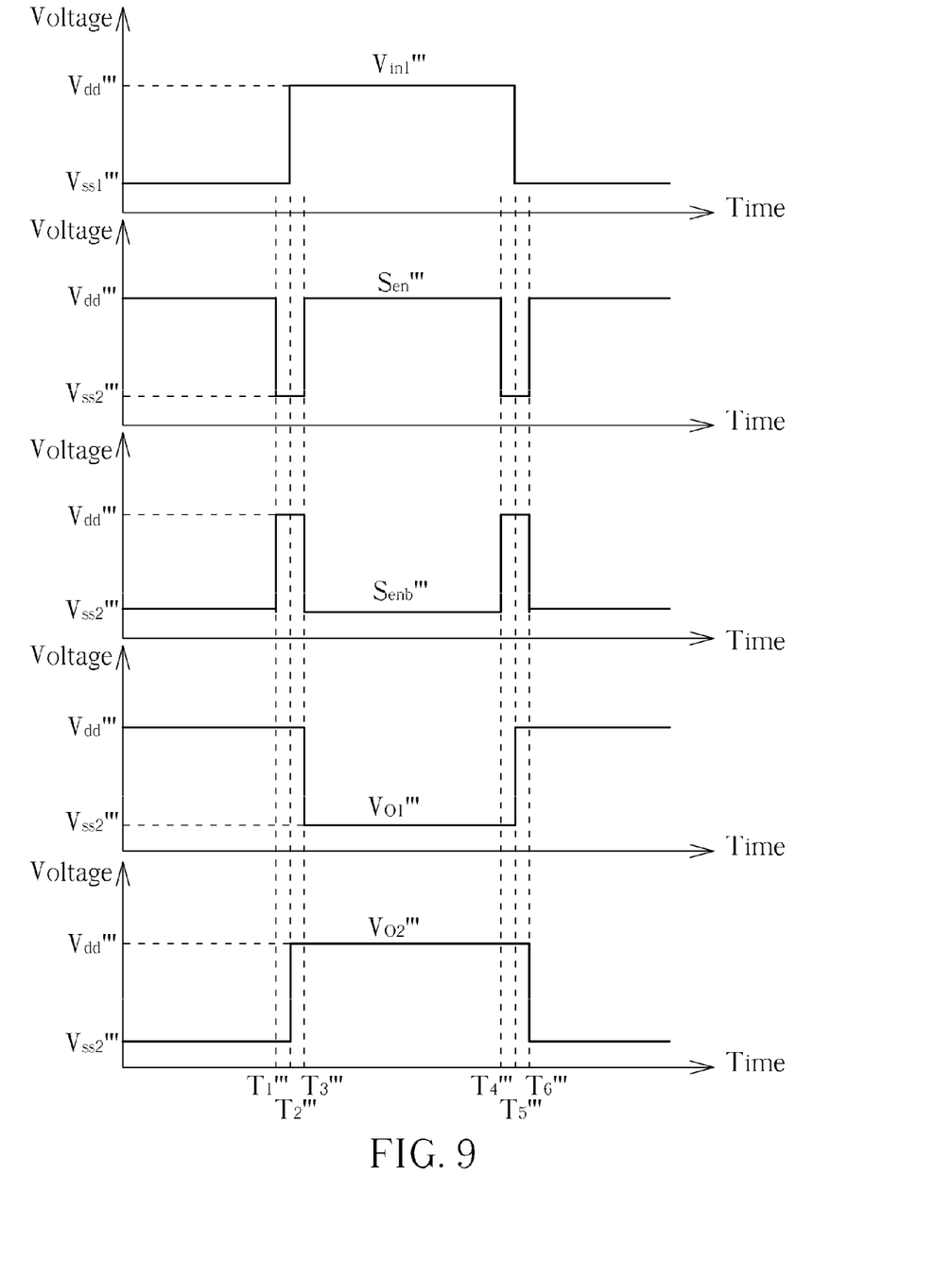
FIG. 9 is a timing diagram illustrating the input signal, the activating control signal, the inversed activating control, and the output signals of the signal level shifting circuit as shown in FIG. 8.

Comparing to the signal level shifting circuit 400 as shown in FIG. 4, two transmission gates are utilized to implement the activating circuit 8044 of the signal level shifting circuit 800 as shown in FIG. 8. Therefore, except for the N type transistors $M_3'''$, $M_4'''$, the activating circuit 8044 further comprises the P type transistors $M_7'''$, $M_8'''$, wherein the gate terminals of the N type transistors $M_3'''$, $M_4'''$ are coupled to the activating control signal $S_{en}'''$, and the gate terminals of the P type transistors $M_7'''$, $M_8'''$ are coupled to an inversed activating control signal $S_{enb}'''$, which has an inversed phase to the activating control signal $S_{en}'''$. On the other hand, according to the fourth embodiment of the present invention, the output signal $V_{o1}'''$ is outputted at a source terminal (i.e., an output terminal $N_{o1}'''$) of the N type transistor $M_3'''$, and the output signal $V_{o2}'''$ is outputted at a source terminal (i.e., an output terminal $N_{o2}'''$) of the N type transistor $M_4'''$, which has an objective to maximize the signal swing between the output signal $V_{o1}'''$ and the output signal $V_{o2}'''$, i.e., $V_{dd}'''-V_{ss2}'''$. Please refer to FIG. 9. FIG. 9 is a timing diagram illustrating the input signal $V_{in1}'''$, the activating control signal $S_{en}'''$, the inversed activating control $S_{enb}'''$, and the output signals $V_{o1}'''$, $V_{o2}'''$ of the signal level shifting circuit 800 as shown in FIG. 8. Similar to the above-mentioned first, second, and third embodiments, the activating circuit 8044 disables the latching circuit 8042 before the level transition appears to the input signal $V_{in1}'''$, and enables the latching circuit 8042 after the level transition appears to the input signal $V_{in1}'''$. More specifically, when the input signal $V_{in1}'''$ transits to the supply voltage $V_{dd}'''$ from the first ground voltage $V_{ss1}'''$ at a time $T_2'''$, the activating control signal $S_{en}'''$ transits to the second ground voltage $V_{ss2}'''$ from the supply voltage $V_{dd}'''$ at a time $T_1'''$ beforehand, and the inversed activating control signal $S_{enb}'''$ transits to the supply voltage $V_{dd}'''$ from the second ground voltage $V_{ss2}''$ at the time $T_1'''$ beforehand. Accordingly, the latching path of the latching circuit 8042 is opened and the latching circuit 8042 can not perform its latching operation, such that the P type transistors $M_1'''$, $M_2'''$ of the input stage circuit 802 transit the output signals $V_{o1}'''$, $V_{o2}'''$ by a relative low current. On the contrary, when the input signal $V_{in1}'''$ transits to the first ground voltage $V_{ss1}'''$ from the supply voltage $V_{dd}'''$ at a time $T_5'''$, the activating control signal $S_{en}'''$ transits to the second ground voltage $V_{ss2}'''$ from the supply voltage $V_{dd}'''$ at a time $T_4'''$ beforehand, and the inversed activating control signal $S_{enb}'''$ transits to the supply voltage $V_{dd}'''$ from the second ground voltage $V_{ss2}'''$ at the time $T_4'''$ beforehand. Similarly, the latching path of the latching circuit 8042 is opened and the latching circuit 8042 can not perform its latching operation, such that the P type transistors $M_1'''$, $M_2'''$ of the input stage circuit 802 transit the output signals $V_{o1}'''$, $V_{o2}'''$ by a relative low current. Please note that, those skilled in this art will readily understand the detailed operation of the signal level shifting circuit 800 as shown in FIG. 8 after reading the disclosures of the first, second, and third embodiments of the present invention, thus the detailed description of the signal level shifting circuit 800 is omitted here for brevity.

Figure 10:
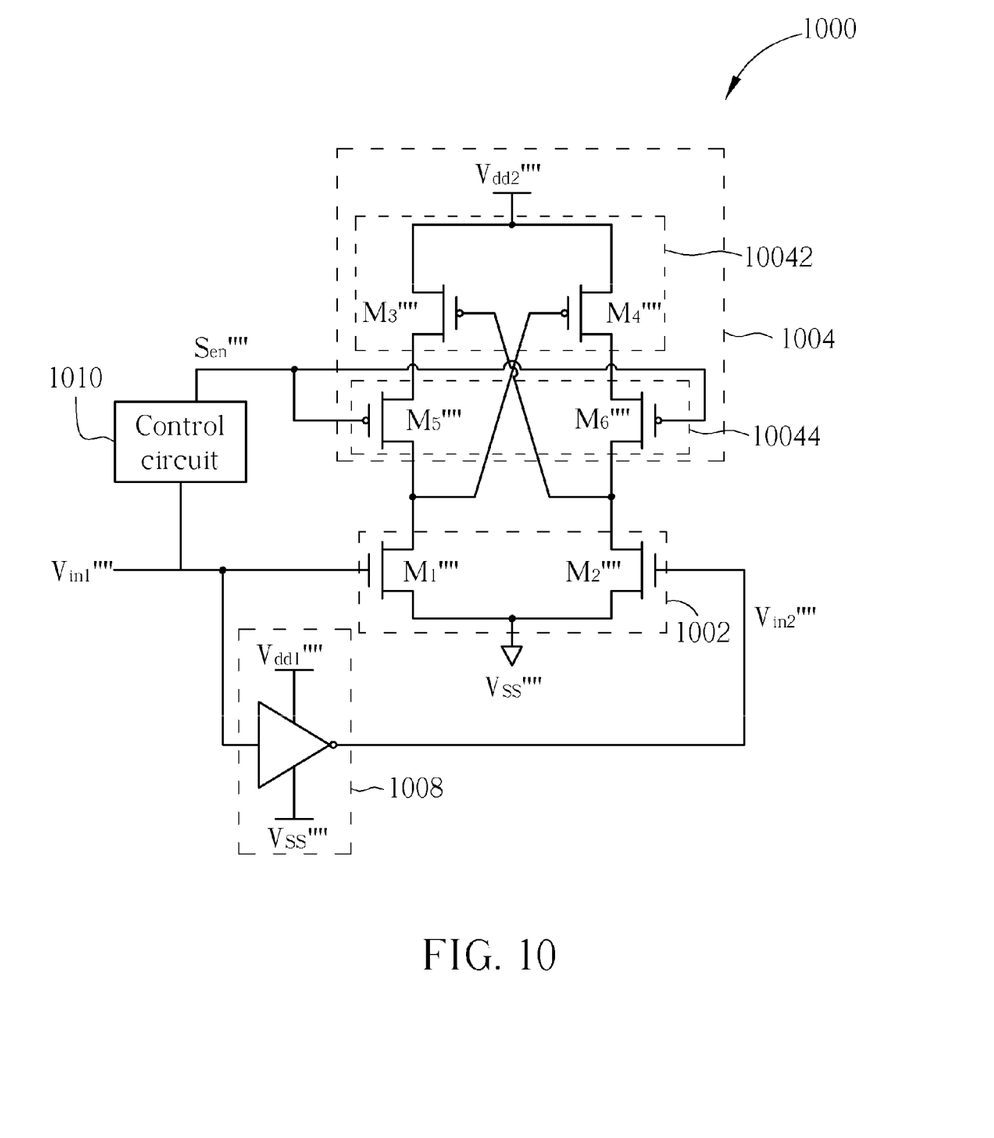
FIG. 10 is a diagram illustrating the signal level shifting circuit according to a fifth embodiment of the present invention.

Please refer to FIG. 10. FIG. 10 is a diagram illustrating a signal level shifting circuit 1000 according to a fifth embodiment of the present invention. The signal level shifting circuit 1000 comprises an input stage circuit 1002, an output signal latching circuit 1004, an inverter 1008, and a control circuit 1010, wherein the input stage circuit 1002 comprises N type transistors $M_1''''$, $M_2''''$, the output signal latching circuit 1004 comprises P type transistors $M_3''''$, $M_4''''$, $M_5''''$, $M_6''''$, and the connectivity of the input stage circuit 1002 and the output signal latching circuit 1004 is as shown in FIG. 10. Compared to the above-mentioned embodiments, the signal level shifting circuit 1000 further comprises the control circuit 1010 for generating an activating control signal $S_{en}''''$ according to an input signal $V_{in1}''''$, wherein the activating control signal $S_{en}''''$ is connected to the gate terminal of the P type transistors $M_5''''$, $M_6''''$. Similar to the above-mentioned embodiments, the control circuit 1010 detects the input signals $V_{in1}''''$, and generates the activating control signal $S_{en}''''$ before the level transition of the input signal $V_{in1}''''$ to control the activating circuit 10044 to open (i.e., turn off) the latching circuit 10042, and enables the latching circuit 10042 after the level transition of the input signal $V_{in1}''''$. Accordingly, the signal level shifting circuit 1000 also has the advantages of small size, fast transition speed, and low leakage current as mentioned in the above paragraphs. Please note that, those skilled in this art will readily understand that the control circuit 1010 of the signal level shifting circuit 1000 shown in FIG. 10 can also be arranged to the first, second, third, and fourth embodiments, which also belong to the scope of the present invention, and the detailed description is omitted here for brevity.

Those skilled in the art will readily observe that numerous modifications and alterations of the device and method may be made while retaining the teachings of the invention.

What is claimed is:

1. A signal level shifting circuit, comprising:
   an input stage circuit, for receiving an input signal, wherein a voltage level of the input signal falls within a first predetermined voltage range; and
   an output signal latching circuit, cascoded with the input stage circuit, comprising:
   a latching circuit, for generating an output signal according to the input signal, wherein a voltage level of the output signal falls within a second predetermined voltage range, and the second predetermined voltage range is different from the first predetermined voltage range; and
   an activating circuit, coupled to the latching circuit for selectively enabling or disabling the latching circuit, wherein when a level transition appears to the input signal, the activating circuit disables the latching circuit.

2. The signal level shifting circuit of claim 1, wherein the activating circuit disables the latching circuit before the level transition appears to the input signal, and enables the latching circuit after the level transition appears to the input signal.

3. The signal level shifting circuit of claim 1, wherein the activating circuit comprises:
   a switching circuit, for selectively enabling or disabling the latching circuit according to an activating control signal; and
   a control circuit, coupled to the switching circuit, for generating the activating control signal.

4. The signal level shifting circuit of claim 3, wherein the input stage circuit comprises:
   a first input transistor, comprising a gate terminal for receiving a first phase input signal of the input signal, and a source terminal coupled to a first reference voltage source; and
   a second input transistor, comprising a gate terminal for receiving a second phase input signal of the input signal, and a source terminal coupled to the first reference voltage source, wherein a phase of the second phase input signal is inversed to a phase of the first phase input signal;
the switching circuit comprises:
   a first switching transistor, comprising a gate terminal for receiving the activating control signal, and a first connecting terminal coupled to a drain terminal of the first input transistor; and
   a second switching transistor, comprising a gate terminal for receiving the activating control signal, and a first connecting terminal coupled to a drain terminal of the second input transistor; and
the latching circuit comprises:
   a first latching transistor, comprising a gate terminal coupled to the drain terminal of the second input transistor, a drain terminal coupled to a second connecting terminal of the first switching transistor, and a source terminal coupled to a second reference voltage source; and
   a second latching transistor, comprising a gate terminal coupled to the drain terminal of the first input transistor, a drain terminal coupled to a second connecting terminal of the second switching transistor, and a source terminal coupled to the second reference voltage source.

5. The signal level shifting circuit of claim 4, wherein the first latching transistor, the second latching transistor, the first switching transistor, and the second switching transistor are P-type field effect transistors, and the first input transistor and the second input transistor are N-type field effect transistors.

6. The signal level shifting circuit of claim 4, wherein the first latching transistor, the second latching transistor, the first switching transistor, and the second switching transistor are N-type field effect transistors, and the first input transistor and the second input transistor are P-type field effect transistors.

7. The signal level shifting circuit of claim 4, wherein the gate terminal of the first switching transistor receives a first phase activating control signal of the activating control signal, the gate terminal of the second switching transistor receives the first phase activating control signal, and the switching circuit further comprises:

a third switching transistor, comprising a gate terminal for receiving a second phase activating control signal of the activating control signal, a first connecting terminal coupled to the drain terminal of the first input transistor, and a second connecting terminal coupled to the drain terminal of the first latching transistor, wherein a phase of the second phase activating control signal is inversed to a phase of the first phase activating control signal; and a fourth switching transistor, comprising a gate terminal for receiving the second phase activating control signal, a first connecting terminal coupled to the drain terminal of the second input transistor, and a second connecting terminal coupled to the drain terminal of the second latching transistor, wherein the first and the third switching transistors comprise a P-type field effect transistor and a N-type field effect transistor respectively, and the second and the fourth switching transistors comprise a P-type field effect transistor and a N-type field effect transistor respectively.

8. The signal level shifting circuit of claim 4, wherein a voltage level generated by the first reference voltage source is higher than the voltage level generated by the second reference voltage source.

9. The signal level shifting circuit of claim 4, wherein a voltage level generated by the second reference voltage source is higher than the voltage level generated by the first reference voltage source.

10. A signal level shifting circuit, comprising:

an input stage circuit, for receiving an input signal, wherein a voltage level of the input signal falls within a first predetermined voltage range, and the input stage circuit comprises:

a first input transistor, comprising a gate terminal for receiving a first phase input signal of the input signal, and a source terminal coupled to a first reference voltage source; and a second input transistor, comprising a gate terminal for receiving a second phase input signal of the input signal, and a source terminal coupled to the first reference voltage source, wherein a phase of the second phase input signal is inversed to a phase of the first phase input signal;

an output signal latching circuit, cascoded with the input stage circuit, comprising:

a latching circuit, for generating an output signal according to the input signal, wherein a voltage level of the output signal falls within a second predetermined voltage range, and the second predetermined voltage range is different from the first predetermined voltage range, and the latching circuit comprising:

a first latching transistor, comprising a gate terminal coupled to the drain terminal of the second input transistor, and a source terminal coupled to a second reference voltage source; and a second latching transistor, comprising a gate terminal coupled to the drain terminal of the first input transistor, and a source terminal coupled to the second reference voltage source; and a switching circuit, comprising:

a first switching transistor, comprising a gate terminal for receiving an activating control signal, a first connecting terminal coupled to a drain terminal of the first input transistor, and a second connecting terminal coupled to the drain terminal of the first latching transistor, wherein the gate terminal of the first switching transistor does not connect to the first connecting terminal of the first switching transistor;

a second switching transistor, comprising a gate terminal for receiving the activating control signal, a first connecting terminal coupled to a drain terminal of the second input transistor, and a second connecting terminal coupled to the drain terminal of the second latching transistor, wherein the gate terminal of the second switching transistor does not connect to the first connecting terminal of the second switching transistor, wherein the gate terminal of the first switching transistor receives a first phase activating control signal of the activating control signal, the gate terminal of the second switching transistor receives the first phase activating control signal;

a third switching transistor, comprising a gate terminal for receiving a second phase activating control signal of the activating control signal, a first connecting terminal coupled to the drain terminal of the first input transistor, and a second connecting terminal coupled to the drain terminal of the first latching transistor, wherein a phase of the second phase activating control signal is inversed to a phase of the first phase activating control signal; and a fourth switching transistor, comprising a gate terminal for receiving the second phase activating control signal, a first connecting terminal coupled to the drain terminal of the second input transistor, and a second connecting terminal coupled to the drain terminal of the second latching transistor, wherein the first and the third switching transistors comprise a P-type field effect transistor and an N-type field effect transistor respectively, and the second and the fourth switching transistors comprise a P-type field effect transistor and an N-type field effect transistor respectively.

11. The signal level shifting circuit of claim 10, wherein the first latching transistor, the second latching transistor, the first switching transistor, and the second switching transistor are P-type field effect transistors, and the first input transistor and the second input transistor are N-type field effect transistors.

12. The signal level shifting circuit of claim 10, wherein the first latching transistor, the second latching transistor, the first switching transistor, and the second switching transistor are N-type field effect transistors, and the first input transistor and the second input transistor are P-type field effect transistors.

13. The signal level shifting circuit of claim 10, wherein a voltage level generated by the first reference voltage source is higher than the voltage level generated by the second reference voltage source.

14. The signal level shifting circuit of claim 10, wherein a voltage level generated by the second reference voltage source is higher than the voltage level generated by the first reference voltage source.

* * * * *